(12) United States Patent
Uvieghara et al.

(10) Patent No.: US 8,908,464 B2
(45) Date of Patent: Dec. 9, 2014

(54) PROTECTION FOR SYSTEM CONFIGURATION INFORMATION

(71) Applicant: QUALCOMM Incorporated, San Diego, CA (US)

(72) Inventors: Gregory Ameriada Uvieghara, Murrieta, CA (US); Michael Batenburg, San Diego, CA (US); Esin Terzioglu, San Diego, CA (US); Yucong Tao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 144 days.

(21) Appl. No.: 13/765,559

(22) Filed: Feb. 12, 2013

(65) Prior Publication Data

US 2014/0226426 A1 Aug. 14, 2014

(51) Int. Cl.
*G11C 5/14* (2006.01)
*G01R 31/36* (2006.01)

(52) U.S. Cl.
CPC ............ *G11C 5/143* (2013.01); *G01R 31/3658* (2013.01)
USPC ....... 365/228; 365/226; 365/201; 365/189.07

(58) Field of Classification Search
CPC .......................... G11C 5/143; G01R 31/3658
USPC ............... 365/226, 228, 201, 189.07
See application file for complete search history.

(56) References Cited

U.S. PATENT DOCUMENTS

| | | | |
|---|---|---|---|
| 6,415,386 B1 * | 7/2002 | Shi et al. | 726/34 |
| 6,738,894 B1 * | 5/2004 | Iwata | 712/200 |
| 6,880,104 B2 * | 4/2005 | Abe et al. | 714/24 |
| 6,930,500 B2 * | 8/2005 | Srivastava | 324/762.02 |
| 6,976,136 B2 * | 12/2005 | Falik et al. | 711/152 |
| 7,051,233 B2 * | 5/2006 | Fukumori et al. | 714/14 |
| 7,154,801 B1 * | 12/2006 | Chu et al. | 365/226 |
| 7,212,954 B2 * | 5/2007 | Amano | 702/185 |
| 7,243,199 B2 * | 7/2007 | Oikawa et al. | 711/163 |
| 7,398,554 B1 * | 7/2008 | Falik et al. | 726/23 |
| 7,743,262 B2 | 6/2010 | Walmsley | |
| 7,821,756 B2 * | 10/2010 | Chishima | 361/93.7 |
| 7,992,009 B2 | 8/2011 | Seo | |
| 8,569,835 B2 * | 10/2013 | Yasumori et al. | 257/355 |
| 2009/0097507 A1 * | 4/2009 | Zhu et al. | 372/6 |
| 2009/0113546 A1 | 4/2009 | Kim et al. | |
| 2011/0234307 A1 | 9/2011 | Marinet et al. | |

FOREIGN PATENT DOCUMENTS

CN 102169719 A 8/2011

* cited by examiner

*Primary Examiner* — Viet Q Nguyen
(74) *Attorney, Agent, or Firm* — Arent Fox LLP

(57) ABSTRACT

Systems and methods for detecting power attacks related to subnormal read voltage on an integrated circuit. Upon initiating power up of the integrated circuit and prior to reading configuration information from non-volatile memory (NVM), test cells associated with the NVM are read first. The test cells share a common power supply with the NVM and output read values from the test cells are configured to deviate from values pre-programmed in the test cells when a subnormal read voltage is applied on the common power supply. Thus, by comparing the output read values with the pre-programmed values, it can be determined whether voltage of the common power supply is subnormal, wherein configuration information will be read incorrectly at a subnormal read voltage. If the voltage is subnormal, power up is aborted. Otherwise, power up is allowed to proceed by reading the configuration information from the NVM.

26 Claims, 4 Drawing Sheets

PROTECTION FOR SYSTEM CONFIGURATION INFORMATION

FIELD OF DISCLOSURE

Disclosed embodiments are directed to protection of system configuration information. More particularly, exemplary embodiments are directed to systems and methods for detecting and avoiding attacks, such as power attacks on system configuration bits stored in non-volatile memories.

BACKGROUND

Conventional processing systems include system configuration information which is used during actions such as system boot-up. Such system configuration information can be in the form of software or program code which may be stored in non-volatile memory (NVM). As known in the art, NVM can retain stored information even when it is not powered. Therefore, the system configuration information stored in the NVM will not be lost when the system is powered down. Accordingly, the system configuration information may be made readily available, for example, during the boot-up process, before the system is fully powered up and operational. Correct use of the system configuration information may be crucial to proper configuration, resource allocation, and general health of the system. Therefore it is important to protect the system configuration information from damage or corruption. If the configuration information was to get corrupted, or if configuration information is read incorrectly or improperly utilized during the system boot-up, then severe and possibly irreparable damage could occur to the system.

The system may come under attack, wherein proper functioning of the system may be disrupted by forcing the configuration information to be read incorrectly. Such attacks may be deliberate, for example, initiated by malicious agents, or they may be triggered inadvertently due to unwanted changes in operating conditions. In one example, the system may come under attack when power supplied to the NVM is lowered from normal read voltage when a read operation is performed on the NVM. When subjected, for example, to a low read voltage that is lower than a normal or standard read voltage used during normal or healthy operating conditions pertaining to the NVM, the ability for corresponding read circuitry to correctly read the contents of the NVM will be affected, and the configuration bits read out under such conditions may be incorrect or different from the programmed configuration bits which were stored in the NVM. Accordingly, the system can be tricked into incorrectly reading configuration bits by lowering read voltage during a read operation on the NVM, and this form of attacking the system is known as a power attack. Conventional processing systems do not have robust mechanisms in place to protect the systems from such power attacks. Accordingly, there exists a need to detect and protect the system from harm in the event of such power attacks.

SUMMARY

Exemplary embodiments of the invention are directed to systems and methods for detecting power attacks related to subnormal read voltage on an integrated circuit. Upon initiating power up of the integrated circuit and prior to reading configuration information from non-volatile memory (NVM), test cells associated with the NVM are read first. The test cells share a common power supply with the NVM and output read values from the test cells are configured to deviate from values pre-programmed in the test cells when a subnormal read voltage is applied on the common power supply. Thus, by comparing the output read values with the pre-programmed values, it can be determined whether voltage of the common power supply is subnormal, wherein configuration information will be read incorrectly at a subnormal read voltage. If the voltage is subnormal, power up is aborted. Otherwise, power up is allowed to proceed by reading the configuration information from the NVM.

Accordingly, an exemplary embodiment is directed to a method of detecting power attacks on an integrated circuit, the method comprising: initiating power up of the integrated circuit, and prior to reading configuration information from non-volatile memory (NVM), reading test cells associated with the NVM, wherein the test cells share a common power supply with the NVM and wherein output read values from the test cells are configured to deviate from values pre-programmed in the test cells when a subnormal read voltage is applied on the common power supply. The method includes comparing the output read values with the pre-programmed values and determining if voltage of the common power supply is subnormal based on the comparison.

Another exemplary embodiment is directed to an integrated circuit comprising a common power supply, a non-volatile memory (NVM) comprising configuration information, coupled to the common power supply, and test cells comprising pre-programmed values, coupled to the common power supply, wherein the test cells are configured to output read values that deviate from the pre-programmed values during a read operation with a subnormal read voltage applied on the common power supply. The apparatus includes logic configured to detect if voltage of the common power supply is subnormal based on a comparison of the output read values from the test cells with the pre-programmed values.

Another exemplary embodiment is directed to a system comprising an integrated circuit, a common power supply means, means for storing configuration information, coupled to the common power supply means, and test means comprising pre-programmed values, coupled to the common power supply means, wherein the test means are configured to output read values that deviate from the pre-programmed values during a read operation with a subnormal read voltage applied on the common power supply means. The system includes means for comparing the output read values from the test means with the pre-programmed values and means for detecting if voltage of the common power supply means is subnormal based on the comparison.

Yet another exemplary embodiment is directed to a non-transitory computer readable storage medium comprising code, which, when executed by a processor, causes the processor to execute instructions for detecting power attacks on an integrated circuit, the non-transitory computer readable storage medium comprising: code for initiating power up of an integrated circuit, code for reading test cells associated with the NVM prior to reading configuration information for the integrated circuit from non-volatile memory (NVM), wherein the test cells share a common power supply with the NVM and wherein output read values from the test cells are configured to deviate from values pre-programmed in the test cells when a subnormal read voltage is applied on the common power supply, code for comparing the output read values with the pre-programmed values, and code for determining if voltage of the common power supply is subnormal based on the comparison.

BRIEF DESCRIPTION OF THE DRAWINGS

The accompanying drawings are presented to aid in the description of embodiments of the invention and are provided solely for illustration of the embodiments and not limitation thereof.

DETAILED DESCRIPTION

Figure 1:
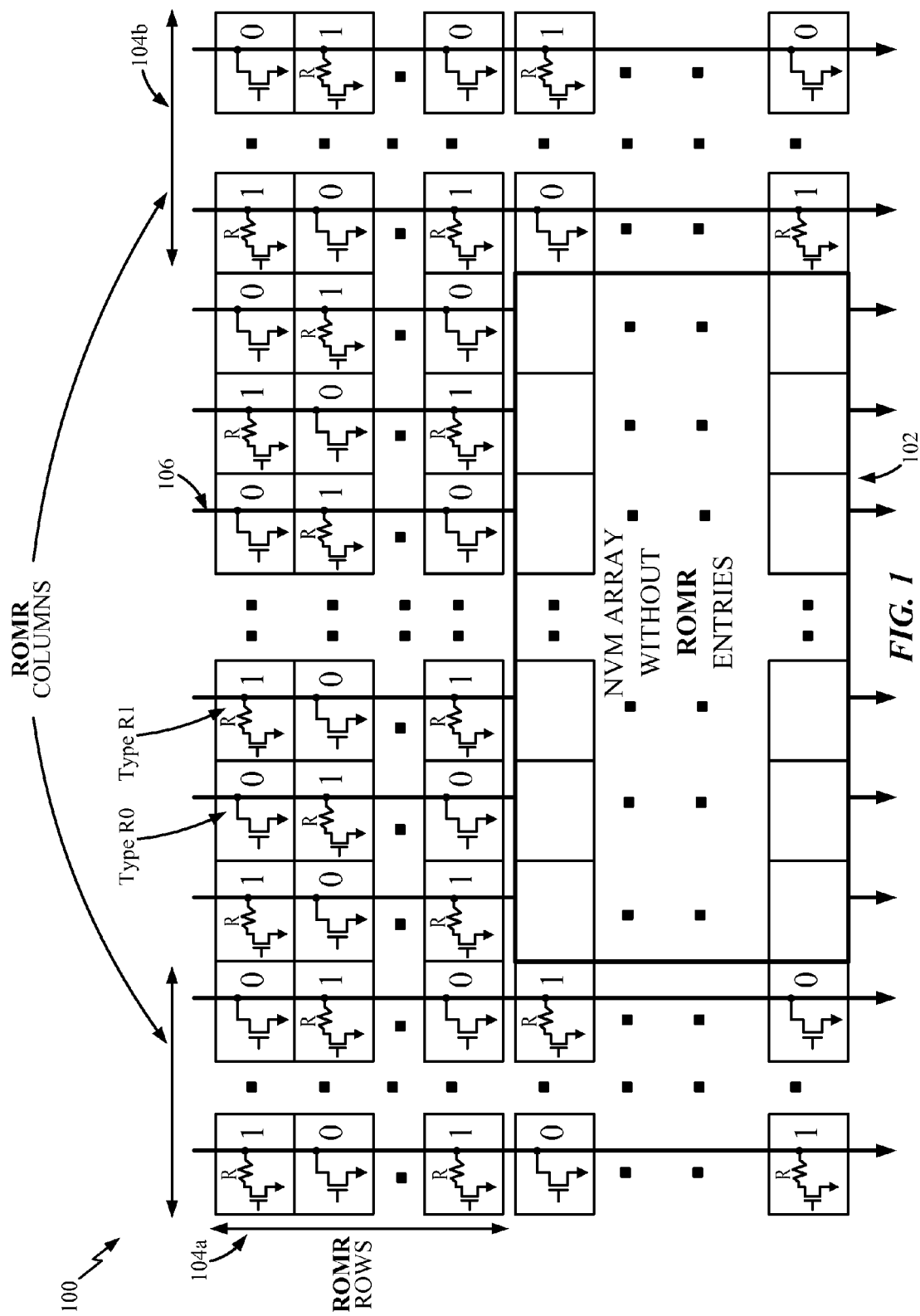
FIG. 1 illustrates an exemplary embodiment comprising ROMR cells 104a/b appended to NVM array 102.

Aspects of the invention are disclosed in the following description and related drawings directed to specific embodiments of the invention. Alternate embodiments may be devised without departing from the scope of the invention. Additionally, well-known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof Further, many embodiments are described in terms of sequences of actions to be performed by, for example, elements of a computing device. It will be recognized that various actions described herein can be performed by specific circuits (e.g., application specific integrated circuits (ASICs)), by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the invention may be embodied in a number of different forms, all of which have been contemplated to be within the scope of the claimed subject matter. In addition, for each of the embodiments described herein, the corresponding form of any such embodiments may be described herein as, for example, "logic configured to" perform the described action.

Exemplary embodiments are directed to protecting a chip or processing system, collectively referred to herein as an "integrated circuit," from power attacks. More particularly, embodiments may include systems and methods for protecting configuration information for the integrated circuit, wherein the configuration information is stored in a non-volatile memory (NVM), from power attacks. In exemplary embodiments, the NVM can include any known non-volatile memory, such as read-only memory (ROM), flash memory, programmable ROM (PROM), erasable ROM (EROM), erasable programmable ROM (EPROM), magnetoresistive random access memory (MRAM), etc. The configuration information stored in the NVM may correspond to any application specific software, instructions, or program code. Accordingly, embodiments may include mechanisms to detect power attacks on the NVM that may be caused by lowering read voltage of the NVM to a subnormal voltage below a normal read voltage, during a read operation on the NVM. As used herein, "normal read voltage" refers to specified or standard read voltage based on technology and implementation of the NVM, wherein reading the NVM at the normal read voltage will result in configuration information stored in the NVM to be read correctly. A "subnormal read voltage" on the other hand, refers to voltage values, pursuant for example to a power attack, wherein reading the NVM at the subnormal voltage may result in configuration information stored in the NVM to be read incorrectly, or cause the NVM to "fail" or result in a "failure" during the read operation.

In order to detect whether a subnormal read voltage is applied on a power supply used for providing read voltage to the NVM during a read operation, one or more embodiments may include test cells, which comprise logic/means that is more susceptible to power attacks than the NVM. As used herein "susceptible" pertains to a characteristic of the test cells to fail or generate incorrect read output values when a subnormal voltage is applied to the test cells during a read operation on the test cells. Accordingly, in exemplary embodiments, test cells may be configured to be more susceptible to power attacks than the NVM, by configuring the test cells to fail or generate incorrect read output values at read voltage values that are higher than subnormal values pertaining to the NVM. In this manner, when a common power supply is used to supply read voltage to both the test cells and the NVM, the test cells will generate incorrect read results at low voltages that are at least equal to (i.e., equal or higher than) the subnormal read voltage of the NVM, and thus, detecting whether the test cells generate incorrect read results can provide a strong indication of whether a subnormal read voltage is applied on the common power supply.

In one exemplary embodiment, the test cells are configured as a read only memory element or a transistor, coupled to a resistor (also known as "ROMR" cells) and provided with a common power supply used to provide read voltage to the NVM. The ROMR cells can be pre-programmed to known values. A copy of the known values pre-programmed in the ROMR cells can be saved, for example, in a memory element provided in the integrated circuit. When a power up or boot up of the integrated circuit is initiated, a read operation on the ROMR cells is performed prior to attempting a read operation on the NVM to obtain configuration information. The output read values from the ROMR cells are compared to the copy of the pre-programmed values. If the comparison reveals that the output read values from the ROMR cells deviate from the pre-programmed values, then it is determined that the read voltage on the common power supply is low enough to cause a failure on the ROMR cells. Consequently, it is concluded that the read voltage on the common power supply is low enough to be a subnormal voltage, pursuant for example to a power attack, which would cause a failure. Since proceeding to read the NVM when it is detected as above that the read would fail (i.e., the data read from the NVM would be erroneous) can lead to serious harm to the integrated circuit, the power up process is aborted and the integrated circuit is returned to or retained at a powered down/reset state until further action can be taken. Such further action can vary based on particular features of the integrated circuit, and can include diagnostic measures which will be recognized by skilled persons and will not be discussed in detail herein. If on the other hand, the output read values from the ROMR cells match the copy of the pre-programmed values, then it is concluded that the read voltage on the common power supply line is safe or normal, and the boot up operation proceeds by reading the NVM to obtain configuration information.

With reference now to FIG. 1, an exemplary embodiment corresponding to circuit 100 is illustrated. Circuit 100 may be integrated in an exemplary integrated circuit (not shown), wherein circuit 100 may include system configuration information. Correspondingly, configuration bits may be stored in NVM array 102, which is supplied with read voltage provided by power supply 106 and used for read operations on NVM array 102. In order to protect NVM array 102 from subnormal voltage during a read operation, circuit 100 includes one or more test cells, such as ROMR cells 104a/b, located as shown along peripheries of NVM array 102. Embodiments are not restricted to the illustrated configuration of ROMR cells 104a disposed in a row direction and ROMR cells 104b disposed along a column direction, but suitable variations are within the scope of the embodiments, for example, alternative embodiments can have test cells located along at least a portion of at least one periphery of NVM array 102. In an exemplary embodiment, read voltages for ROMR cells 104a/b can also be provided by power supply 106, such that a common power supply is coupled to the ROMR cells 104a/b as well as NVM array 102.

A ROMR cell may be constructed from a transistor coupled to a resistor. More specifically, an exemplary ROMR cell of type R1 is shown to be programmed to a binary or logical "1" value. A type R1 ROMR cell has a resistor "R" of nonzero resistance (or resistance of nonzero value) introduced between power supply 106 (or bit line) and drain terminal of a metal oxide semiconductor (MOS) transistor, wherein a source terminal of the MOS transistor is grounded. On the other hand, an exemplary ROMR cell of type R0 is shown to be programmed to a logical "0" value. A type R0 ROMR cell includes a MOS transistor, whose drain terminal is directly connected to power supply 106 without an intervening resistor "R" as in the case of ROMR cell of type R1. In other words, a type R0 ROMR cell has a zero resistance (or a resistor with resistance of zero value). As shown, a pattern of ROMR cells including cells of type R1 and R0 are used to program a pattern on logical "1"s and "0"s in rows and columns comprising ROMR cells 104a and 104b in circuit 100.

The value of the resistance of resistor R in ROMR cells of type R1 are such that the programmed logical value of "1" in the ROMR cell will be read out incorrectly at voltages equal to or lower than a selected read voltage value, referred to herein as the ROMR failure voltage. The ROMR failure voltage can be selected to be higher than the subnormal read voltage of NVM array 102, at which configuration bits stored in NVM array 102 may be read out incorrectly. Accordingly, in some embodiments, the ROMR failure voltage can be controlled by adjusting the resistance value of the resistor component of the corresponding ROMR cell. The ROMR failure voltage can be selected to be equal to or preferably higher than the subnormal voltage of NVM array 102 to budget for an error margin in some embodiments.

Pursuant to a power up of the integrated circuit, prior to commencing a read operation on circuit 100 to obtain the configuration bits stored in NVM array 102, ROMR cells 104a/b will be first read out in exemplary embodiments to detect whether a subnormal voltage is applied on power supply 106, pursuant for example, to a power attack. Since the ROMR failure voltage is higher than the subnormal voltage, the values read out from ROMR cells 104a/b (particularly, the ROMR cells of type R1 which are programmed to a value "1") will deviate from the pre-programmed values (i.e., be read out as "0") for voltage values lower than the equal to or lower than the ROMR failure voltage (which includes the attack voltage). In other words, if the values read out from ROMR cells 104a/b deviate from the pre-programmed values, it may be assumed or concluded that the read voltage on power supply 106 may be as low as the subnormal voltage which would cause a read failure if NVM array 102 is read, and subsequently a read operation on NVM array 102 as well as power up of the integrated circuit will be aborted.

If on the other hand, values read out from ROMR cells 104a/b match the expected pre-programmed values, then it may be assumed or concluded that the voltage on power supply 106 was not lowered to a subnormal voltage, and the boot-up process can proceed by reading the configuration bits from NVM array 102 without fear of possible harm or danger to the integrated circuit.

Figure 2:
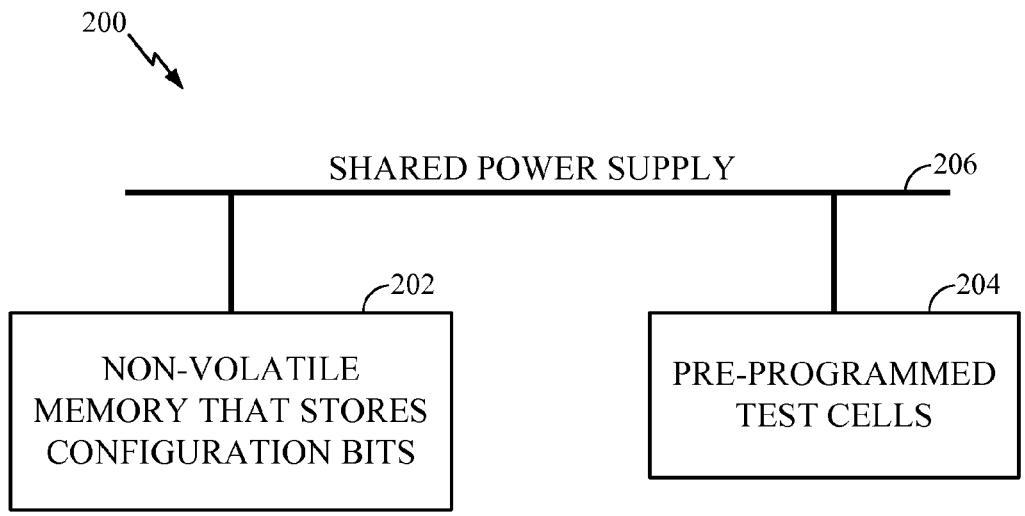
FIG. 2 illustrates an exemplary embodiment comprising test cells 204 coupled to NVM 202 with a shared power supply 206.

With reference now to FIG. 2, another exemplary embodiment related to protecting an exemplary system or integrated circuit from power attacks on related configuration information is illustrated. Circuit 200 may be associated with an exemplary system or integrated circuit, wherein circuit 200 may include NVM 202 comprising configuration information related to the exemplary system or integrated circuit. Similar to ROMR cells 104a/b of types R1 and R0 discussed above, any pre-programmed test cells which are susceptible to read failures at voltages equal to or higher than subnormal voltages of NVM 202 can be used. In this case, test cells 204 are coupled to NVM 202, but they are not required to be arranged along peripheries of NVM 202. Rather, test cells 204 may be arranged in a location that is physically separate or separated from NVM 202, and merely coupled to a common voltage for read operations, such as power supply 206 which provides read voltage to both NVM 202 and test cells 204. Circuit 200 is similar to circuit 100 in remaining aspects, in that during a read operation, test cells 204 will first be read out, and their values will deviate from expected pre-programmed values if subnormal read voltage is applied on shared power supply 206.

Figure 3:
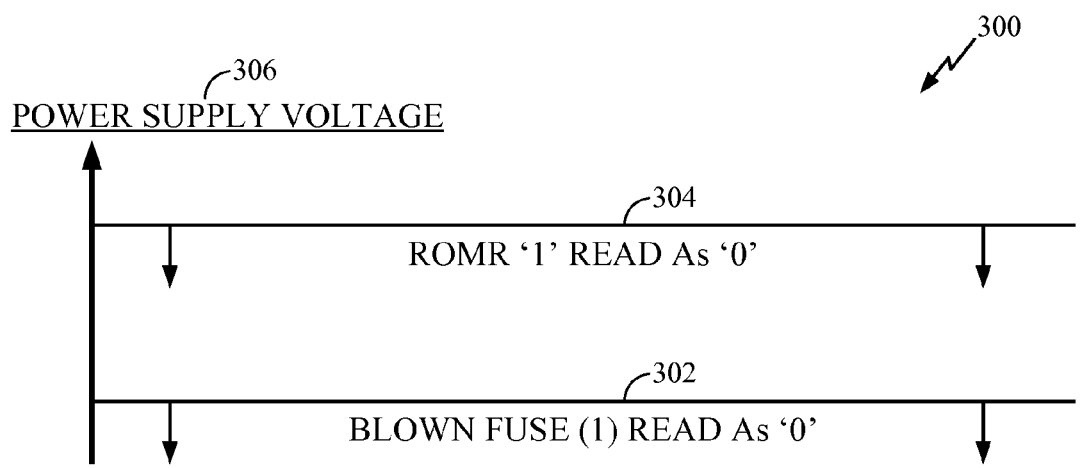
FIG. 3 illustrates an exemplary embodiment with NVM 302 comprising fuse-based configuration bits and resistance of ROMR 304 chosen between resistances of blown and unblown fuse bit values.

Coming now to FIG. 3, yet another exemplary embodiment related to protection of an integrated circuit associated with system 300 is illustrated. In system 300, NVM 302 comprising configuration bits may be fuse-based. In other words, information may be stored by burning or blowing binary bits on fuses that form NVM 302. A blown fuse bit representatively holds a logic value "1", while an unblown fuse bit representatively holds a logic value "0." The resistance of a blown fuse bit is higher than the resistance of an unblown fuse bit. ROMR 304 can include an array or pattern of ROMR cells of types R1 and R0 described above. The resistance R of a type R1 ROMR cell, in this embodiment, can be selected such that the corresponding ROMR failure voltage is chosen to be higher than the subnormal read voltage of NVM 302. In other words, the value of the resistor R of the type R1 ROMR cell is chosen such that the voltage at which the type R1 ROMR cell (i.e., which is programmed to a value "1") will be incorrectly read out as "0" is chosen to be higher than the voltage at which a blown fuse bit of NVM 302 (i.e., which stores a value "1") will be incorrectly read out as "0." Thus reading a value of "0" from a type R1 ROMR cell of ROMR 304 can indicate that the read voltage on power supply 306 is subnormal.

Accordingly, embodiments may utilize various techniques which can include test cells, such as ROMR cells, wherein reading unexpected or incorrect values from the ROMR cells indicates that a subnormal read voltage is applied to the corresponding NVM pursuant, for example, to a power attack. Accordingly, a related system for which configuration information is stored in the NVM can be protected by aborting reading from the NVM and retaining the system in a reset or powered down state.

Figure 4:
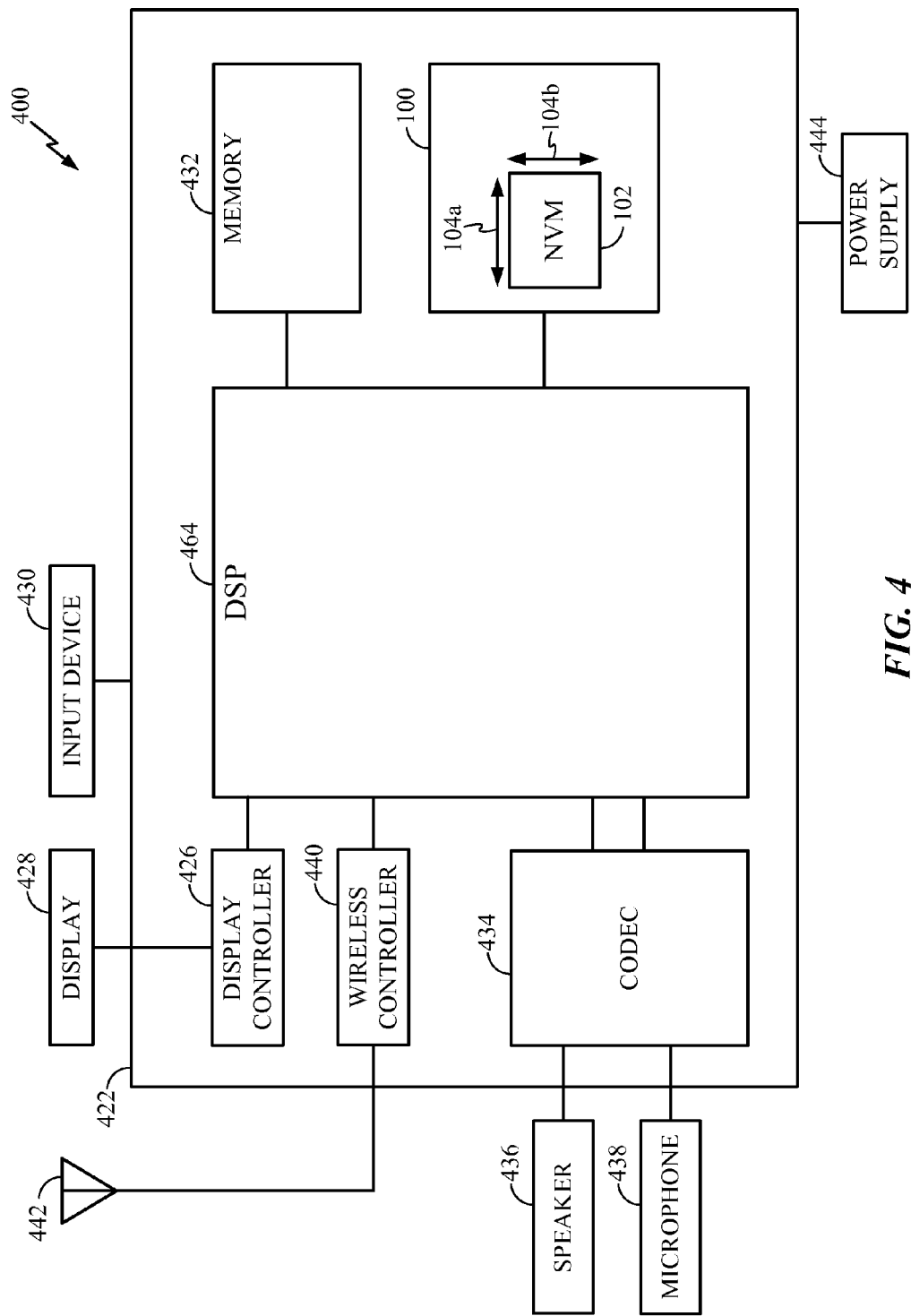
FIG. 4 illustrates a wireless communication device configured according to exemplary embodiments.

With reference now to FIG. 4, a wireless communication device, device 400, configured according to exemplary embodiments is illustrated. As shown in FIG. 4, device 400 includes digital signal processor (DSP) 464. DSP 464 may be coupled to a circuit comprising configuration information, such as circuit 100 described with respect to FIG. 1. Accordingly, circuit 100 may comprise NVM 102 configured to store configuration bits related to power up of circuit 100 and ROMR cells 104a/b (comprising pre-programmed pattern of ROMR cells of types R1 and R0) configured to detect and protect circuit 100 from power attacks. DSP 464 can be coupled to memory 432, wherein memory 432 can be configured to save a copy of known values that are pre-programmed in ROMR cells 104a/b. During a power up process (for example, initiated through power supply 444), logic/means, for example integrated in DSP 464 can be configured to read ROMR cells 104a/b prior to reading NVM 102 and compare the output read values from ROMR cells 104a/b with the copy saved in memory 432. If there is a match, then the power up process may be allowed to proceed by reading NVM 102. If there is a mismatch, then the power up process may be aborted and device 400 may be returned to a power up or reset state.

Additionally, as illustrated in FIG. 4, display controller 426 can be coupled to DSP 464 and to display 428. Coder/decoder (CODEC) 434 (e.g., an audio and/or voice CODEC) can be coupled to DSP 464. Other components, such as wireless controller 440 (which may include a modem) are also illustrated. Speaker 436 and microphone 438 can be coupled to CODEC 434. FIG. 4 also indicates that wireless controller 440 can be coupled to wireless antenna 442. In a particular embodiment, DSP 464, display controller 426, memory 432, CODEC 434, and wireless controller 440 are included in a system-in-package or system-on-chip device 422.

In a particular embodiment, input device 430 and power supply 444 are coupled to the system-on-chip device 422. Moreover, in a particular embodiment, as illustrated in FIG. 4, display 428, input device 430, speaker 436, microphone 438, wireless antenna 442, and power supply 444 are external to the system-on-chip device 422. However, each of display 428, input device 430, speaker 436, microphone 438, wireless antenna 442, and power supply 444 can be coupled to a component of the system-on-chip device 422, such as an interface or a controller.

It should be noted that although FIG. 4 depicts a wireless communications device, DSP 464 and memory 432 may also be integrated into a set-top box, a music player, a video player, an entertainment unit, a navigation device, a personal digital assistant (PDA), a fixed location data unit, or a computer. A processor (e.g., DSP 464) may also be integrated into such a device.

Figure 5:
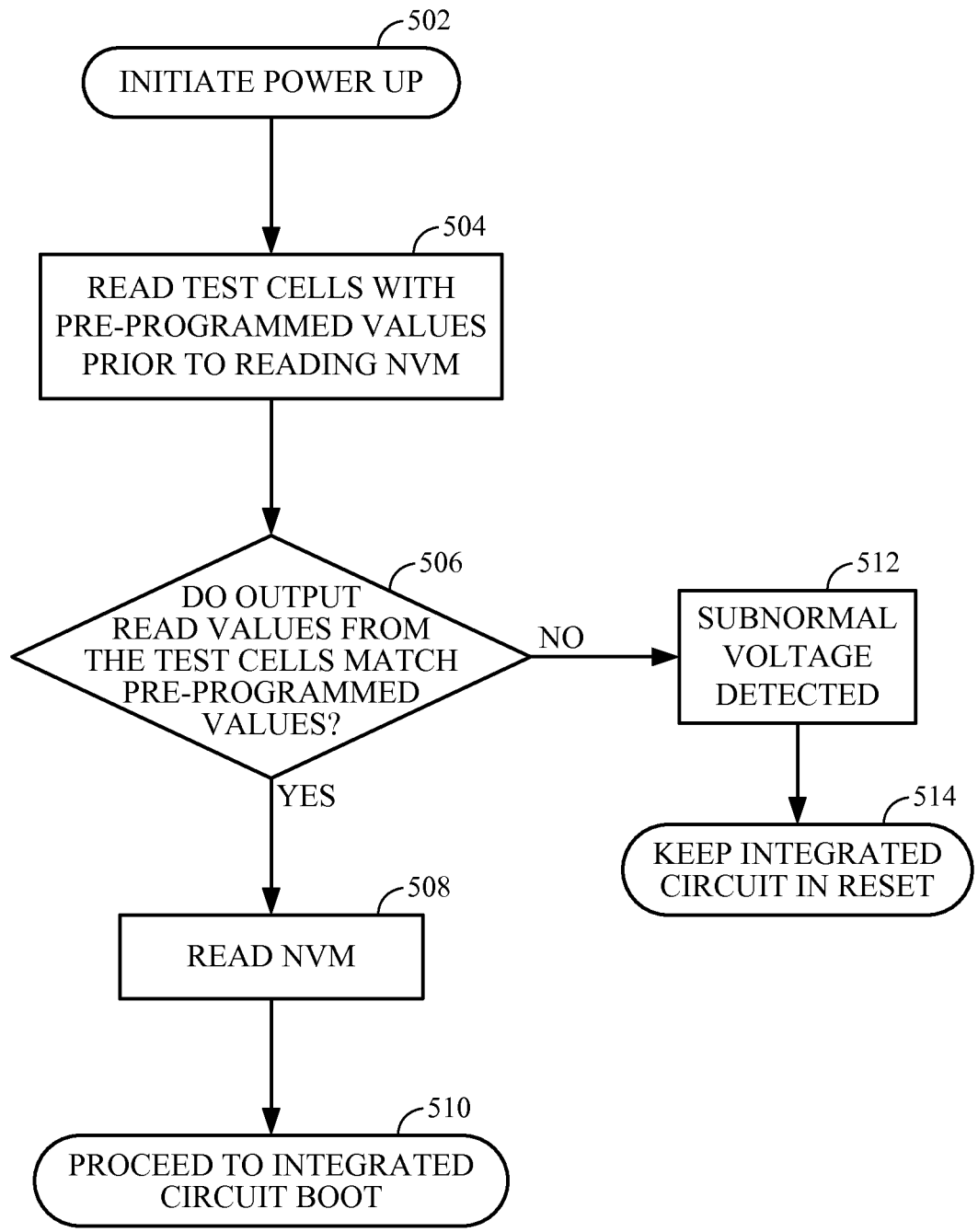
FIG. 5 illustrates a flow chart corresponding to an exemplary method of protecting a system by using test cells to detect whether a power attack has occurred on memory comprising configuration information pertaining to the system.

It will also be appreciated that embodiments include various methods for performing the processes, functions and/or algorithms disclosed herein. For example, as illustrated in FIG. 5, an embodiment can include a method of detecting a power attack on an integrated circuit, such as device 400 of FIG. 4, and protecting the integrated circuit from deleterious effects of the power attack. The method can include initiating power up/boot-up for the integrated circuit (e.g., triggered via power supply 444 of FIG. 4)—Block 502; prior to reading configuration information from non-volatile memory (NVM) (e.g., NVM 102), reading test cells associated with the NVM (e.g., ROMR cells 104a/b), wherein the test cells share a common power supply (e.g., power supply 106) with the NVM and wherein output read values from the test cells are configured to deviate from values pre-programmed in the test cells when a subnormal read voltage is applied on the common power supply—Block 504; comparing the output read values from the test cells with the pre-programmed values to determine whether the output read values match the pre-programmed values (e.g., determining by DSP 464 whether values read from ROMR cells 104a/b match a copy of the pre-programmed values saved in memory 432)—Block 506. The method can further include, if the output read values from the test cells match the pre-programmed values, then continuing on to read configuration information from the NVM—Block 508, and proceeding with the boot-up of the integrated circuit—Block 510. On the other hand, from Block 506, if the output read values of the test cells fail to match the expected pre-programmed values, then determining that voltage of the common power supply is subnormal—Block 512; and aborting power up and retaining the integrated circuit in reset or powered down state—Block 514.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The methods, sequences and/or algorithms described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor.

Accordingly, an embodiment of the invention can include a computer readable media embodying a method for detecting and preventing power attacks on configuration bits of a system. Accordingly, the invention is not limited to illustrated examples and any means for performing the functionality described herein are included in embodiments of the invention.

While the foregoing disclosure shows illustrative embodiments of the invention, it should be noted that various changes and modifications could be made herein without departing from the scope of the invention as defined by the appended claims. The functions, steps and/or actions of the method claims in accordance with the embodiments of the invention described herein need not be performed in any particular order. Furthermore, although elements of the invention may be described or claimed in the singular, the plural is contemplated unless limitation to the singular is explicitly stated.

What is claimed is:

1. A method of detecting power attacks on an integrated circuit, the method comprising:
   initiating power up of the integrated circuit;
   prior to reading configuration information from non-volatile memory (NVM), reading test cells associated with the NVM, wherein the test cells share a common power supply with the NVM and wherein output read values from the test cells are configured to deviate from values pre-programmed in the test cells when a subnormal read voltage is applied on the common power supply;
   comparing the output read values with the pre-programmed values; and
   determining if voltage of the common power supply is subnormal based on the comparison.

2. The method of claim 1, wherein if the voltage of the common power supply is subnormal, aborting the power up of the integrated circuit.

3. The method of claim 1, wherein if the voltage of the common power supply is normal, proceeding with the power up of the integrated circuit and reading configuration information from the NVM.

4. The method of claim 1, wherein the NVM comprises an NVM array of NVM cells and the test cells are located along at least a portion of a periphery of the NVM array.

5. The method of claim 1, wherein the NVM comprises an NVM array of NVM cells and the test cells are arranged in a location separated from the NVM array.

6. The method of claim 1, wherein the test cells comprise a read only memory element coupled to a resistor (ROMR cell), wherein a resistance of the resistor is selected such that for read voltages below a ROMR failure voltage an output read value of the ROMR cell will deviate from a value pre-programmed in the ROMR cell, and wherein the ROMR failure voltage is higher than the subnormal voltage.

7. The method of claim 6, wherein a resistance of value zero represents a logical "0" programmed in the ROMR cell, and a resistance of nonzero value represents a logical "1" programmed in the ROMR cell.

8. The method of claim 6, wherein the NVM comprises fuse bits and wherein the ROMR failure voltage is selected to be higher than a read voltage at which a value of a blown fuse bit is read out as zero.

9. An integrated circuit comprising:
   a common power supply;
   a non-volatile memory (NVM) comprising configuration information, coupled to the common power supply;
   test cells comprising pre-programmed values, coupled to the common power supply, wherein the test cells are configured to output read values that deviate from the pre-programmed values during a read operation with a subnormal read voltage applied on the common power supply; and
   logic configured to detect if voltage of the common power supply is subnormal based on a comparison of the output read values from the test cells with the pre-programmed values.

10. The integrated circuit of claim 9, further comprising logic configured to abort a power up of the integrated circuit if the voltage of the common power supply is detected to be subnormal.

11. The integrated circuit of claim 9, further comprising logic configured to prevent a read operation on configuration information stored in the NVM, if the voltage of the common power supply is detected to be subnormal.

12. The integrated circuit of claim 9, further comprising logic configured to power up the integrated circuit if the voltage of the common power supply is detected to be normal.

13. The integrated circuit of claim 9, further comprising logic configured to read configuration information from the NVM if the voltage of the common power supply is detected to be normal.

14. The integrated circuit of claim 9, wherein the NVM comprises an NVM array of NVM cells and the test cells are located along at least a portion of a periphery of the NVM array.

15. The integrated circuit of claim 9, wherein the NVM comprises an NVM array of NVM cells and the test cells are arranged in a location separated from the NVM array.

16. The integrated circuit of claim 9, wherein the test cells comprise a read only memory element coupled to a resistor (ROMR cell), wherein a resistance of the resistor is selected such that for read voltages below a ROMR failure voltage an output read value of the ROMR cell will deviate from a value pre-programmed value in the ROMR cell, and wherein the ROMR failure voltage is higher than the subnormal voltage.

17. The integrated circuit of claim 16, wherein a resistance of value zero represents a logical "0" programmed in the ROMR cell, and a resistance of nonzero value represents a logical "1" programmed in the ROMR cell.

18. The method of claim 16, wherein the NVM comprises fuse bits and wherein the ROMR failure voltage is selected to be higher than a read voltage at which a value of a blown fuse bit is read out as zero.

19. A system comprising:
   an integrated circuit;
   a common power supply means;
   means for storing configuration information, coupled to the common power supply means;
   test means comprising pre-programmed values, coupled to the common power supply means, wherein the test means are configured to output read values that deviate from the pre-programmed values during a read operation with a subnormal read voltage applied on the common power supply means; and
   means for comparing the output read values from the test means with the pre-programmed values; and
   means for detecting if voltage of the common power supply means is subnormal based on the comparison.

20. The system of claim 19, further comprising means for aborting power up of the integrated circuit, based on an output of the means for detecting.

21. The system of claim 19, further comprising means for preventing a read operation on the means for storing configuration information, based on an output of the means for detecting.

22. The system of claim 19, wherein the test means are located along at least a portion of a periphery of the means for storing configuration information.

23. The system of claim 19, wherein the test means are arranged in a location separated from the means for storing configuration information.

24. A non-transitory computer readable storage medium comprising code, which, when executed by a processor, causes the processor to execute instructions for detecting power attacks on an integrated circuit, the non-transitory computer readable storage medium comprising:

code for initiating power up of an integrated circuit;
 code for reading test cells associated with the NVM prior to reading configuration information for the integrated circuit from non-volatile memory (NVM), wherein the test cells share a common power supply with the NVM and wherein output read values from the test cells are configured to deviate from values pre-programmed in the test cells when a subnormal read voltage is applied on the common power supply;
 code for comparing the output read values with the pre-programmed values; and
 code for determining if voltage of the common power supply is subnormal based on the comparison.

25. The non-transitory computer readable storage medium of claim 24, further comprising code for aborting the power up of the integrated circuit if the voltage of the common power supply is determined to be subnormal.

26. The non-transitory computer readable storage medium of claim 24, further comprising code for proceeding with the power up of the integrated circuit if the voltage of the common power supply is determined to be normal.

* * * * *